(12) United States Patent
Bozorg-Grayeli et al.

(10) Patent No.: US 11,881,438 B2
(45) Date of Patent: Jan. 23, 2024

(54) FIRST-LEVEL INTEGRATION OF SECOND-LEVEL THERMAL INTERFACE MATERIAL FOR INTEGRATED CIRCUIT ASSEMBLIES

(71) Applicant: Intel Corporation, Santa Clara, CA (US)

(72) Inventors: Elah Bozorg-Grayeli, Chandler, AZ (US); Kyle Arrington, Gilbert, AZ (US); Sergio Chan Arguedas, Chandler, AZ (US); Aravindha Antoniswamy, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 750 days.

(21) Appl. No.: 16/746,732

(22) Filed: Jan. 17, 2020

(65) Prior Publication Data
US 2021/0225729 A1 Jul. 22, 2021

(51) Int. Cl.
| H01L 23/373 | (2006.01) |
| H01L 23/367 | (2006.01) |
| H01L 23/16 | (2006.01) |
| H01L 23/00 | (2006.01) |
| H01L 21/48 | (2006.01) |

(52) U.S. Cl.
CPC ...... *H01L 23/3733* (2013.01); *H01L 21/4853* (2013.01); *H01L 21/4871* (2013.01); *H01L 23/16* (2013.01); *H01L 23/367* (2013.01); *H01L 23/562* (2013.01); *H01L 24/16* (2013.01); *H01L 2224/16225* (2013.01); *H01L 2924/3511* (2013.01)

(58) Field of Classification Search
CPC .... H01L 23/3733; H01L 23/16; H01L 23/376
See application file for complete search history.

(56) References Cited

U.S. PATENT DOCUMENTS 5,909,056 A * 6/1999 Mertol ............... H01L 23/3675
257/796
11,387,161 B2 * 7/2022 Eid ..................... H01L 23/3675

* cited by examiner

*Primary Examiner* — Dale E Page
*Assistant Examiner* — Wilner Jean Baptiste
(74) *Attorney, Agent, or Firm* — Essential Patents Group, LLP

(57) ABSTRACT

A second-level thermal interface material (TIM2) that is to couple to a system-level thermal solution is applied to an integrated circuit (IC) assembly comprising an IC die and an assembly substrate prior to the assembly substrate being joined to a host component at the system-level. Challenges associated with TIM2 application may therefore be addressed at a first level of IC die integration, simplifying subsequent assembly and better controlling thermal coupling to a subsequently applied thermal solution. Where a first-level IC assembly includes a stiffener, the TIM may be affixed to the stiffener through an adhesive bond or a fusion bond. After the IC assembly including the TIM is soldered to the host board, a thermal solution may be placed in contact with the TIM. With early application of a solder TIM, a solder TIM may be reflowed upon the IC die multiple times.

18 Claims, 9 Drawing Sheets

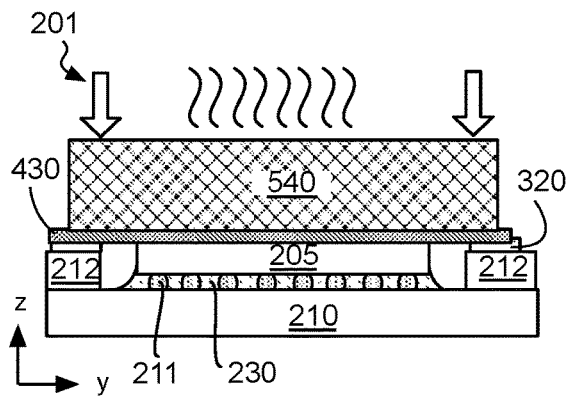 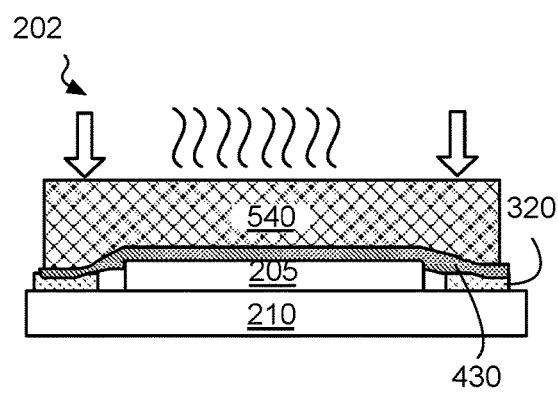
FIG. 5A  FIG. 5B
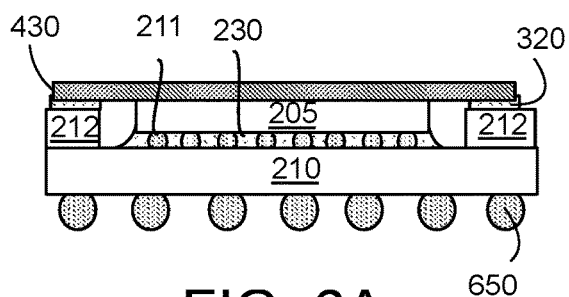 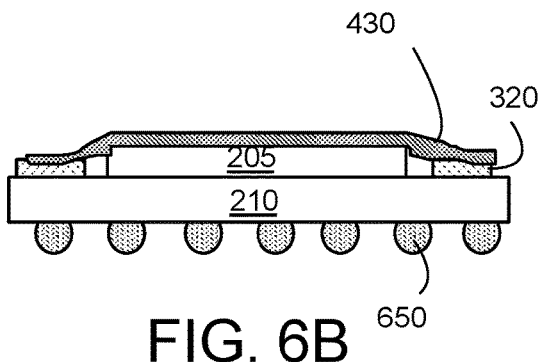
FIG. 6A  FIG. 6B
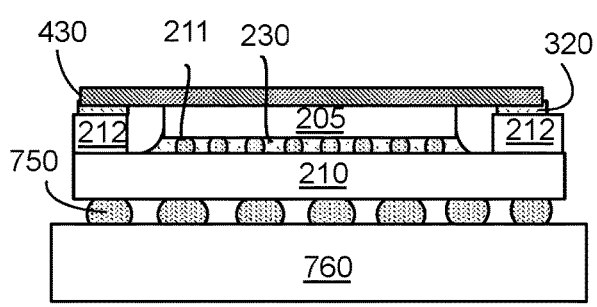 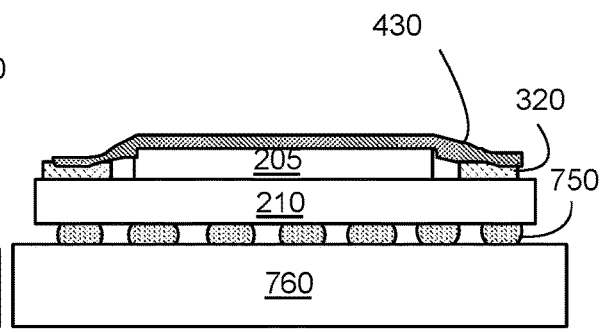
FIG. 7A  FIG. 7B

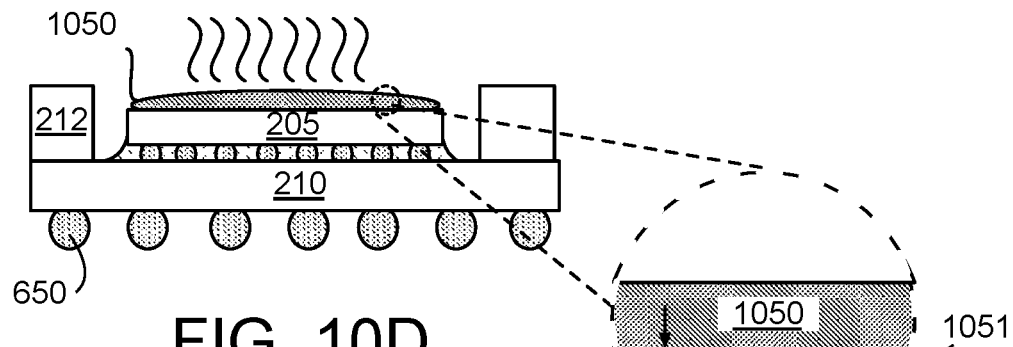
FIG. 10D
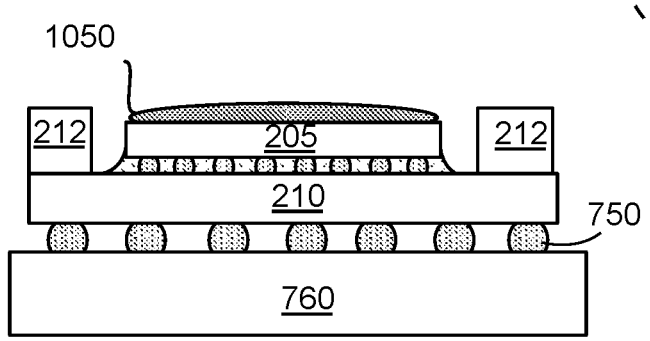
FIG. 10E
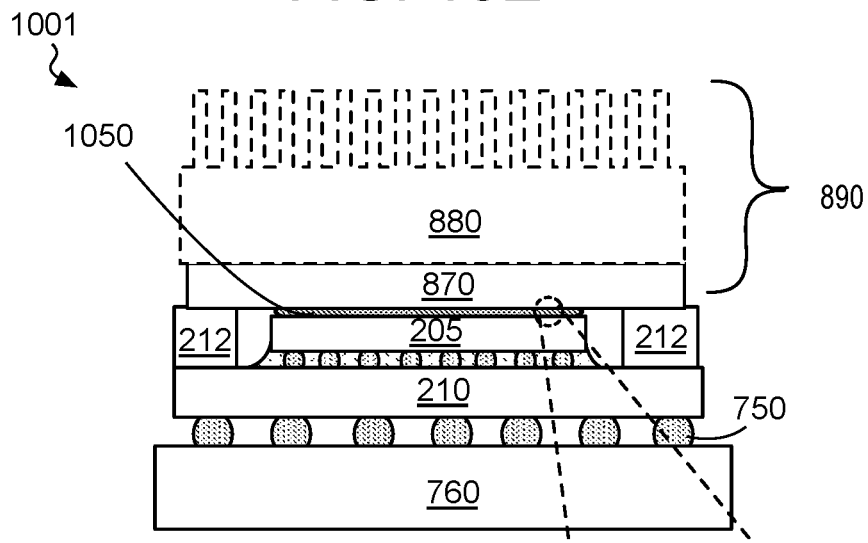
FIG. 10F
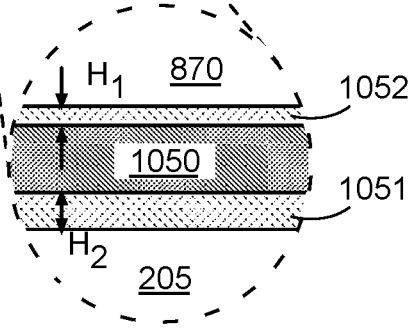

FIRST-LEVEL INTEGRATION OF SECOND-LEVEL THERMAL INTERFACE MATERIAL FOR INTEGRATED CIRCUIT ASSEMBLIES

BACKGROUND

As computing devices continue to get smaller and more powerful, thermal management presents new challenges. System-level thermal solutions, such as heat sinks, are commonly coupled with integrated circuit (IC) die through the use of a thermal interface material, to transport heat generated during operation of the IC die, and to dissipate that heat to the external environment. Thermal interface materials can be semi-solid or liquid, such as greases, polymers or solders, for example.

The thermal capability of an IC die relies heavily on the performance of the thermal interface material that makes contact with a thermal solution. However, in the manufacture of many electronic devices, application of the thermal interface material, along with the thermal solution that it will be in contact with, is left to a system-level integrator responsible for second-level assembly of a first-level IC die assembly that was purchased from an IC die supplier. As such, the IC die supplier is faced with the challenge of qualifying a variety of potential higher-level integrations to ensure a worst-case threshold performance for the IC die regardless of what option a system-level integrator may select. Such qualification is time and labor intensive as many well-known and well-characterized solutions must be requalified for each new IC die. An IC die manufacturer may also be prevented from achieving the best possible thermal performance because of the assembly challenges a superior thermal interface material may pose to the system-level integrator.

There is therefore a need for an IC assembly architecture that will allow an IC die to be coupled to a system-level thermal solution through an optimal thermal interface material without placing a greater burden on the system-level integrator.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 2A, 3A, 4A, 5A. 6A and 7A illustrate cross-sectional views of an IC assembly evolving as the methods of FIG. 2 are practiced, in accordance with some embodiments;

FIGS. 2B, 3B, 4B, 5B. 6B and 7B illustrate cross-sectional views of an IC assembly evolving as the methods of FIG. 1 are practiced, in accordance with some alternative embodiments;

FIGS. 10A, 10B, 10C, 10D, 10E and 10F illustrate cross-sectional views an IC assembly evolving as the methods of FIG. 1 are practiced, in accordance with some alternative embodiments;

DETAILED DESCRIPTION

Figure 1:
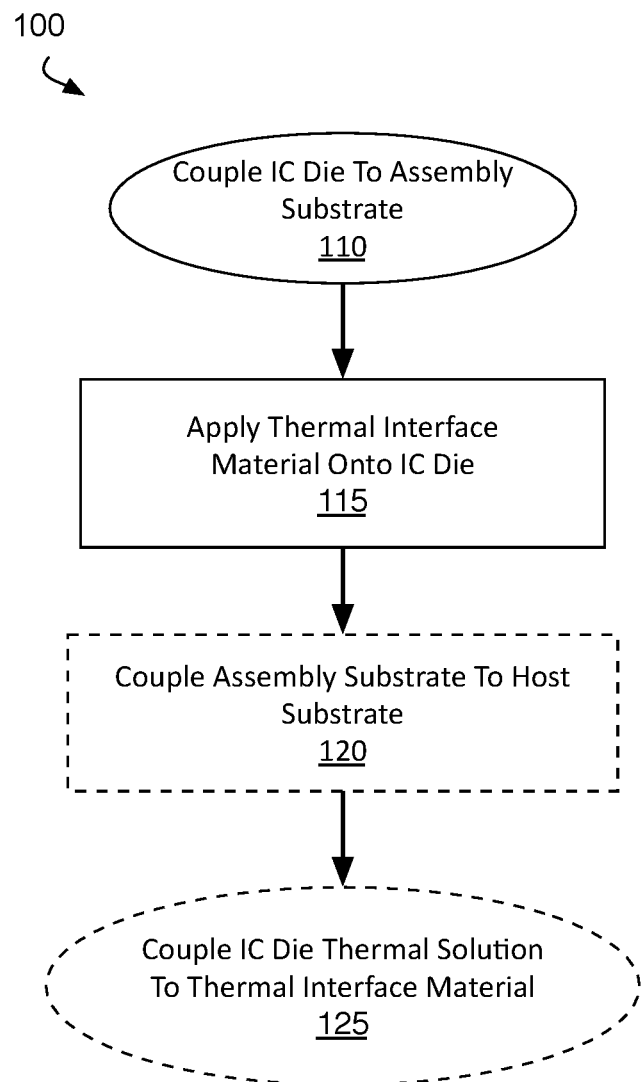
FIG. 1 illustrates a flow diagram of methods for forming an IC assembly including first-level integration of second-level IC die thermal interface material, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As described further below, prior to attaching an integrated circuit (IC) assembly to a host component during higher-level component assembly, a thermal interface material (TIM) that is to be contacted by a thermal solution (e.g., any heat exchanger) is integrated into the IC assembly. This early-stage integration of a TIM into an IC assembly is referred to herein as "first-level TIM assembly." Notably, this first-level assembly does not further include the thermal solution with which the TIM is to interface. Upon subsequent integration of the first-level IC assembly with a host component (e.g., a motherboard), a thermal solution may be applied to the exposed TIM. Because the TIM makes direct contact with a thermal solution that has been integrated at a later stage of assembly, the TIM is referred to herein as a "second-level TIM." Some advantages and features of integrating a second-level TIM at a first-level of assembly are further described below.

FIG. 1 illustrates a flow diagram of methods 100, which may be practiced to form an IC assembly that includes second-level IC die thermal interface material, which is integrated at a first assembly level, in accordance with some embodiments. As shown, methods 100 begin with coupling an IC die to an assembly substrate at block 110, thereby forming an IC assembly. Block 110 may be performed as a first level of integrating an IC die into an IC assembly that may be further integrated into a computing system or electronic device platform. Although not limited in this context, block 110 is most typically performed by an IC die fabrication facility in preparation for the sale of a minimally packaged IC die product. Alternatively, methods 100 may begin with receiving, as an input, an IC assembly that includes an IC die coupled to an assembly substrate. Hence, methods 100 may include the practice of first-level assembly, or some of the first-level assembly may have been performed upstream of methods 100.

The IC die may be any type of IC die including, but not limited to, a microprocessor, a controller, a field programmable gate array (FPGA), an application specific IC (ASIC), a system-on-chip (SOC), an electronic memory chip (e.g., DRAM, flash memory, etc.), a graphics processor, an artificial intelligence (AI) accelerator, etc. The IC die may be electrically coupled to any suitable assembly substrate, either through first level interconnects (FLI), or through direct (e.g., hybrid) bonding, for example. The assembly substrate is typically larger in area than the IC die, and it may further host any number of other IC die, as well as other active and/or passive devices. The assembly substrate may be another IC die, a passive or active interposer glass, organic, or semiconductor), a package substrate, a mold material (with or without fan-out build-up metallization layers embedded therein), a first-level board, or any other substrate known to be similarly suitable for interconnecting directly with an IC die. In some further embodiments, the assembly substrate may be physically coupled with an assembly stiffener that may, for example, reduce any tendency of the assembly substrate to warp.

At block 120, a thermal interface material is affixed so as to be in direct contact with a surface of the IC die that is opposite the assembly substrate. Because this is a second-level TIM (i.e., TIM2), any thermal interface material known to be suitable for transferring heat between an IC die and an external thermal solution may be applied at block 120. The composition may be selected, for example, based on thermal performance needed. In some embodiments, the TIM has a thermal conductivity of greater than 4 watt per meter-kelvin (W/(mK)). The TIM may have any composition having a sufficiently high thermal conductivity for the IC die and/or system into which the IC die is to be integrated. The TIM may be polymer or polymer composite (e.g., metallic or ceramic particles in silicone), metal, phase change material (PCM), graphite sheet, carbon nanotube composite, or low-melting temperature metal or metal alloy (e.g., solder), for example.

Any technique known to be suitable for applying a particular thermal interface material to an IC die may be practiced at block 120. For embodiments that include an assembly stiffener, the TIM may be advantageously adhered to the assembly stiffener, either directly through fusion of the materials, or through an adhesive material that may be applied to either perimeter edge of the TIM preform or to a surface of the stiffener opposite the assembly substrate. The adhesive may be cured as needed to hold the thermal interface material in contact with, or at least in close proximity to, the IC die, where it is to remain throughout subsequent assembly operations before being further contacted with a thermal solution. Oversizing the TIM preform so that it extends over the stiffener has the advantage of limiting any adhesive material to be only off the IC die surface, improving thermal contact between the thermal interface material and the IC die. For embodiments lacking a stiffener, a TIM preform may still be oversized so it may be adhered at block 120 to a portion of the assembly substrate beyond the perimeter edge of the IC die, again avoiding adhesive material on the IC die surface. In other embodiments, TIM may be affixed directly to the IC die surface. For example, a solder preform may be applied to the IC die surface, temporarily retained there, for example with a solder flux, and reflowed to make intimate contact with the IC die surface.

With the second-level thermal interface material affixed, methods 100 subsequently integrate the IC assembly into a higher-level assembly. In FIG. 1, all blocks associated with upper-level assembly are denoted by dashed line, beginning with block 120 where the IC assembly substrate is electrically coupled to a host substrate, such as, but not limited to, a host board (e.g., motherboard). The host substrate is typically larger in area than the IC assembly substrate, and it may further host any number of other IC die, as well as other active and/or passive devices. In some exemplary embodiments, a surface of the assembly substrate opposite the IC die is coupled to the host substrate with a solder feature suitable as second-level interconnects (2LI), such as a ball-grid-array (BGA) or a surface mount structure, for example. The TIM will therefore experience any solder/reflow process employed to mount the assembly substrate to the host substrate.

Methods 100 are completed at block 125 where an IC die thermal solution is applied so as to be in direct contact with the second-level TIM. The thermal solution may be any heat exchanger known to be suitable for an IC die. Although heat exchanger architecture may vary, it generally includes a surface that is to be placed in direct contact with the second-level TIM. The heat exchanger may be a system-level heat sink, cold plate, or heat pipe, for example. With methods 100 substantially complete, assembly of the electronic device, may continue according to any known methods.

As illustrated in FIG. 1, first-level integration of a second-level TIM is to be distinguished from first-level integration of a first-level TIM that instead does not make direct contact with any thermal solution that is introduced during subsequent (upper-level) integration of the first-level assembly. Embodiments herein are also to be distinguished from a second-level TIM that, along with the thermal solution, is subsequently integrated with a first-level IC assembly at some higher (e.g., second) level of assembly. Notably, first-level integration of a second-level TIM in accordance with embodiments herein allow a first-level integrator to implement a particular second-level TIM that is most suitable to, or optimal for, a particular IC die. Any highest performing second-level TIM may therefore be introduced without burdening the subsequent assembly process. First-level integration of the second-level TIM also allows the first-level integrator to more fully leverage first-level assembly technology, which may be better suited to the challenges associated with application of a highest performing second-level TIM. Early-stage integration of the second-level TIM may also achieve more consistent thermal performance since integration of the second-level TIM with the IC die surface becomes fixed, and only the interface to the thermal solution may vary with the subsequent application of a thermal solution.

FIG. 2A-7A illustrate cross-sectional views of an IC assembly evolving as the methods 100 are practiced, in accordance with some embodiments. FIG. 2B-7B illustrate cross-sectional views of another IC assembly evolving as the methods 100 are practiced, in accordance with some alternative embodiments. While these examples are provided to further illustrate certain aspects and features of methods 100, not all features included in these examples are required by methods 100.

Figure 2A:
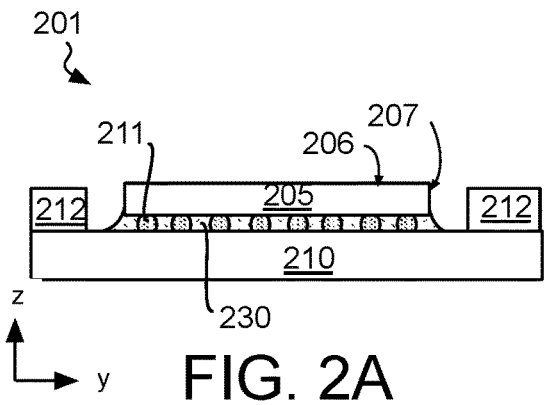

FIG. 2A illustrates some examples of a first-level IC assembly 201 that includes an IC die 205 attached to an assembly substrate 210. Although only one IC die 205 is illustrated, two or more IC die 205 may be similarly attached to assembly substrate 210. IC die 205 may be any type of IC die. Assembly substrate 210 may be any suitable substrate to which an IC die may be attached. In the example shown FIG. 2A, IC die 205 is attached to assembly substrate 210 by a FLI 211. FLI 211 may be microbumps, for example, which may include a solder joint, but need not. Other FLI technologies may be used in alternative embodiments. IC die 205 has an upper-surface 206 and a perimeter edge (or sidewall) 207. In the exemplary embodiment where IC die 205 is flip-chip attached, surface 206 is a back-side of IC die 205. In some embodiments, surface 206 is a bare semiconductor surface (e.g., monocrystalline silicon). In other embodiments, surface 206 is a back-side die metallization (e.g., Cu, Ti, Ni, or Au).

Although IC die 205 may occupy any footprint (area), assembly substrate 210 has a larger footprint or area than that of IC die 205. Beyond IC die edge 207 is an assembly substrate stiffener 212. Stiffener 212 may be a continuous or segmented frame partially or entirely encircling IC die 205. Stiffener 212, may be permanently affixed to assembly substrate 210 through any means, such as, but not limited to any suitable adhesive (e.g., epoxy or other thermoset resins) or solder. Stiffener 212 may have any composition that provides desired stiffness (bulk modulus). In some embodiments, stiffener 212 is a continuous sheet of metal, such as stainless steel, aluminum, or copper. In some further embodiments, stiffener 212 includes a bulk metal and a surface finish of another metal. Nickel is one exemplary surface finish, which may be plated upon a copper or stainless steel bulk, for example.

Depending on how IC die 205 is coupled to assembly substrate 210, attachment may further comprise one or more adhesives or sealants. In the example illustrated in FIG. 2A, an underfill material 230 surrounds FLI 211. Underfill material 230 may, for example, comprise an epoxy resin with a filler, such as fumed silica. The epoxy resin and filler may be selected to achieve a good coefficient of thermal expansion (CTE) match with FLI 211 and/or with IC die 205.

Figure 2B:
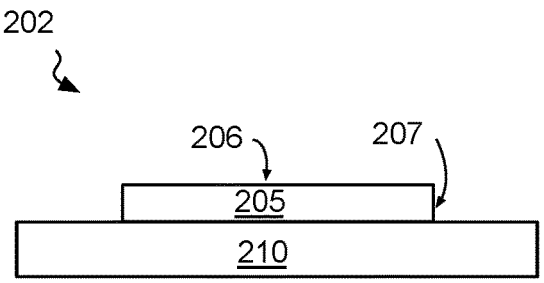

FIG. 2B illustrates an example of a first-level IC assembly 202 that also includes IC die 205 attached to assembly substrate 210. In FIG. 2B, reference numbers introduced in FIG. 2A are retained for features that have one or more of the attributes previously described. As shown in FIG. 2B, IC die 205 is directly bonded to assembly substrate 210. Although not illustrated, electrical connections between assembly substrate 210 and IC die 205 are made through a sintered (solid state fusion) interface between corresponding metallization features in each of substrate 210 and IC die 205. These conductive features may be surrounded by a dielectric material that will also bond at a hybrid-bonding interface between substrate 210 and IC die 205. For such embodiments, assembly substrate 210 may be another IC die, an interposer (active or passive), or any other substrate capable of direct bonding to IC die 205. As further illustrated in FIG. 2B, IC assembly 202 lacks any assembly substrate stiffener. Although the absence of an assembly substrate stiffener is not dependent upon a direct bond between IC die 205 and assembly substrate 210, such a joint between and IC die and substrate may reduce the need for a stiffener.

Figure 3A:
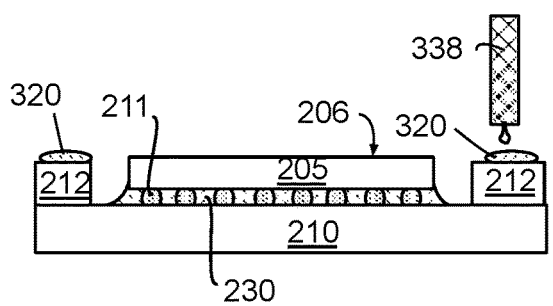
Figure 3B:
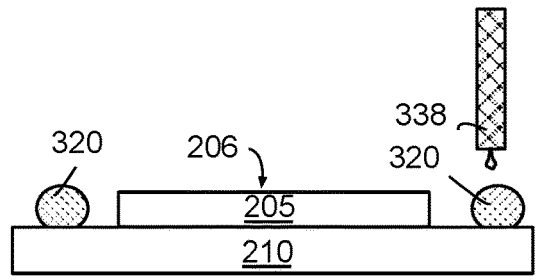

FIG. 3A illustrates an example where an adhesive 320 is dispensed upon a surface of stiffener 212 opposite substrate 210. Adhesive 320 may be dispensed by any means suitable for a material having particular physical properties (e.g., thixotropic and viscosity, etc.). For the exemplary embodiment illustrated, a jet dispenser 338 applies adhesive 320 only on stiffener 212, leaving IC die surface 206 substantially free of any adhesive material. Adhesive material 320 may be an epoxy, for example. Adhesive material 320 may also include vinylesters and polyesters, or any other thermoset resin material that has sufficient tack to retain a TIM preform before the adhesive is cured. FIG. 3B illustrates an alternative embodiment where adhesive 320 is dispensed upon a surface substrate 210, beyond the perimeter edge of IC die 205, leaving IC die surface 206 substantially free of any adhesive material. For embodiments where it is on substrate 210, adhesive 320 may have a significantly greater height (e.g., z-dimension) to account for the absence of a stiffener. Adhesive 320 may therefore have a high thixotropic index (e.g., >3) as-dispensed to achieve any structural adhesive material buildup needed to seat a TIM preform of a predetermined profile.

Figure 4A:
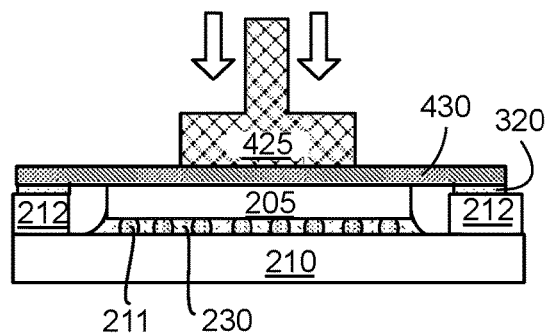
Figure 4B:
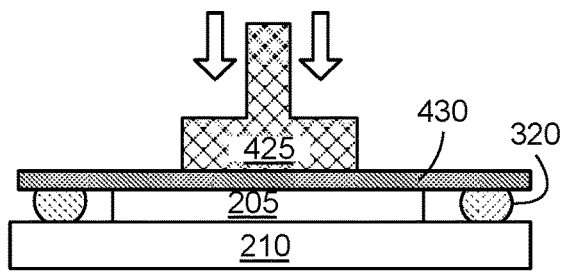

FIG. 4A illustrates an example where a TIM 430 is applied over IC die 205 to make contact with adhesive 320. TIM 430 may be handled as preform with a pick-and-place machine 425, for example, and aligned to be over IC die 205. Tack of uncured adhesive 320 is to hold TIM 430 in place when released by pick-and-place machine 425. As shown, the lateral dimension (e.g., y-axis) of TIM 430 is oversized to span IC die 205 and further extend beyond IC die 205 a distance sufficient to also be over at least a portion of stiffener 212. Although in this example adhesive 320 was applied to stiffener 212, in other embodiments TIM 430 includes adhesive material limited to regions of TIM 430 that may overlap stiffener 212 (and excluding regions of preform 430 that will contact IC die 205). In the alternative embodiment shown in FIG. 4B, TIM 430 is again planar and has a lateral dimension oversized to span the entire lateral dimension of IC die 205 to further overlap adhesive 320 that is adjacent to a perimeter edge of IC die 205.

TIM 430 may comprise any material have suitable thermal conductivity, TIM 430 may be hard or soft (e.g., <55 on the Shore A hardness scale). TIM preform 430 may have a substantially homogenous composition. TIM 430 may alternatively have a heterogeneous composition, such as a composite structure or a multi-layered laminate structure. In some examples, TIM 430 comprises predominantly a polymer, a metal, a phase change material (PCM), graphite, or a carbon nanotube composite. While many polymers may be suitable, some examples include silicone-based polymers (i.e., polysiloxanes comprising silicon, oxygen, carbon), synthetic rubbers, and natural rubber. Advantageously, the polymer has high temperature stability (e.g., suitable for temperatures of 150° C., or more). PCM materials may further comprise any suitable mixture of organic binders, and ceramic fillers, such as, but not limited to $Al_2O_3$, BN, AlN or ZnO. For PCM embodiments, TIM 430 may further comprise a foil or woven mesh carrier.

In some embodiments, TIM 430 is carbon-based. For example a filler of graphitic material (e.g., crystalline graphite, pyrolytic graphite) may be suspended in a binder or matrix resin. Graphitic structures within a matrix may also have a low bulk modulus, displaying high compressibility (e.g., 40%, or more). The graphitic material may be in any form, such as a stack of 2D sheets oriented, for example, orthogonal to the surface of IC die 205. The graphitic material may also be in the form of nanotubes (e.g., with longitudinal lengths extending predominantly in the z-dimension). For such embodiments, the matrix material may be a polymer.

For embodiments where TIM 430 is multi-layered, a base or core layer may be sandwiched between two interface layers. For example, any of the materials described above may serve as a core layer, which may be sandwiched between two layers of a material that can sinter with the surface of IC die 205, as well as sinter with a surface of a base plate of any thermal solution subsequently applied. A sinterable material is one that will diffuse into another material while in the solid-state, which can occur at temperatures well below the material melting point. In some examples, the sinterable material comprises at least one of Au, Ag, In, Bi, Ga, or Sn. The sinterable material layer may be discontinuous and/or have A material with nanostructure having structural features with a nanoscale length (e.g., less than 1000 nm). Such nanostructure may facilitate low thermal contact resistances and/or facilitate sintering with IC die 205.

In still other embodiments, TIM 430 is a contiguous sheet of a metal. Exemplar)/metals include, Au, Ag, In, Bi, Ga, or Sn, any and all of which have high thermal conductivity and any of which may sinter (solid-state fusion), or form an intermetallic compound (liquid fusion) if the sheet has sufficiently low melting temperature.

As further illustrated in the two embodiments illustrated in FIGS. 5A and 5B, adhesive 320 is cured, for example at an elevated temperature (e.g., 100-300° C.). The curing of adhesive 320 is to permanently affix the TIM 430 to first-level IC assembly 201/202. In the illustrated example, pressure is applied by press 540 to hold TIM 430 against IC die 205 during the adhesive cure. Following adhesive cure, TIM 430 may be substantially planar (as shown in FIG. CA), or deformed beyond an edge of IC die 205 (as shown in FIG. 6B), for example, depending on the as-cured structural thickness of adhesive 320 (and height of stiffener 212).

Notably, adhesive TIM attachment and cure may be performed immediately following attachment of stiffener 212, or as late as a pre-die test stage. Following adhesive cure, IC die test may be performed. In the examples further illustrated in FIGS. 6A and 6B, solder balls 650 are further attached to a side of assembly substrate 210 opposite IC die 205. With adhesive 320 cured, any suitable ball attach process may be performed in the presence of TIM 430. In the state shown in FIGS. 6A and 6B, the IC assemblies 201 and 202 are substantially complete through first-level assembly. In this state, TIM 430 may already be in intimate contact with IC die surface 206, or it may have yet to achieve intimate contact, for example where such contact develops during higher-level assembly operations.

Second-level assembly is further illustrated in FIG. 7A, 7B. During second-level assembly, IC assembly 201 and 201 are coupled to a host component 760 through second level interconnects (2LI) 750. 2LI 750 couple input/output signals, power, ground, etc. to and from IC assemblies 201, 202. In the illustrated examples, 2LI 750 are reflows of solder balls 650, for example. Surface mount (e.g., solder paste LGA) or socket mount technologies may also be used in alternative embodiments. Host component 760 has a larger footprint than IC assembly 201 (202) and 2LI 750 may have a significantly coarser interconnect feature pitch than FLI 211. Host component 760 may be any component known to be suitable as a host to an IC assembly, such as, but not limited to, a printed circuit board.

Figure 8A:
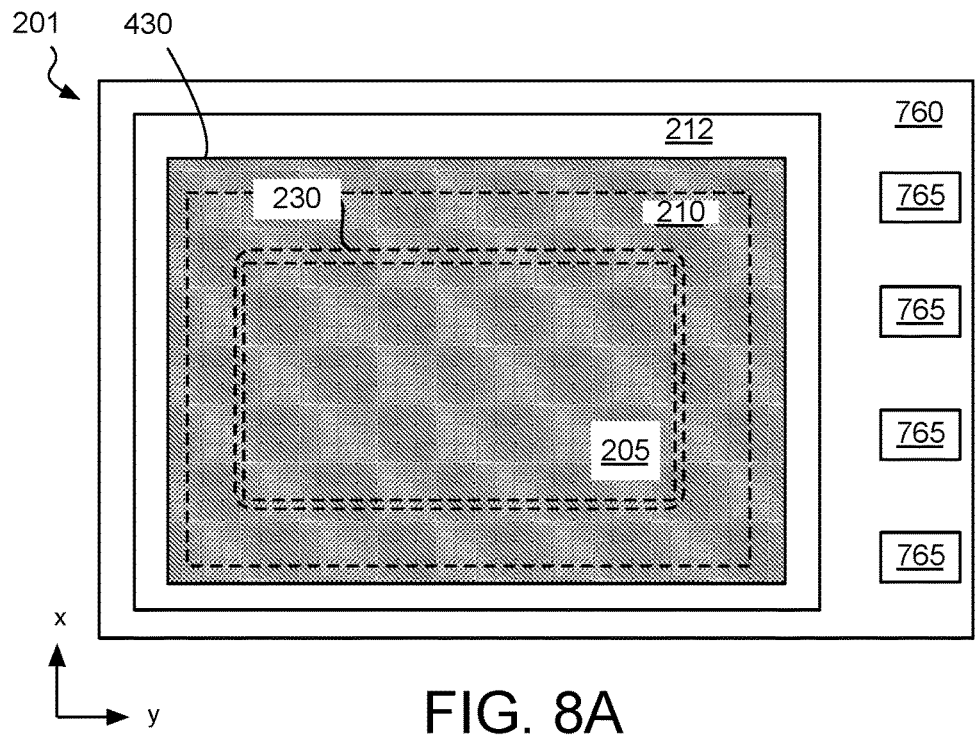
FIGS. 8A and 8B illustrate a plan view and a cross-sectional view, respectively, of an IC assembly including a second-level IC die thermal interface material that has been applied during first-level assembly, in accordance with some embodiments.

FIG. 8A illustrates a plan view of IC assembly 201, in accordance with some embodiments. As shown, stiffener 212 is a contiguous frame completely enclosing IC die 205 (shown in dashed line to emphasize it is completely under TIM material 430). One or more gaps or recesses may be present in stiffener 212, for example to allow for venting/outgassing of the IC assembly. TIM 430 may be adhered to stiffener 212 along the entire perimeter defined by stiffener 212, or only within discrete regions of stiffener 212. In some advantageous embodiments, TIM 430 is adhered to at least a majority of the surface of the stiffener opposite the assembly substrate. FIG. 8A, further illustrates one or more die-side components 765 on host substrate 760. Die-side components 765 may include one or more of processors, controllers, sensors, memory devices, passive devices, etc, which may be coupled with IC die 205 through electrical routing embedded within host substrate 760 (not depicted), through 2LI 750, and through routing of substrate 210.

Figure 8B:
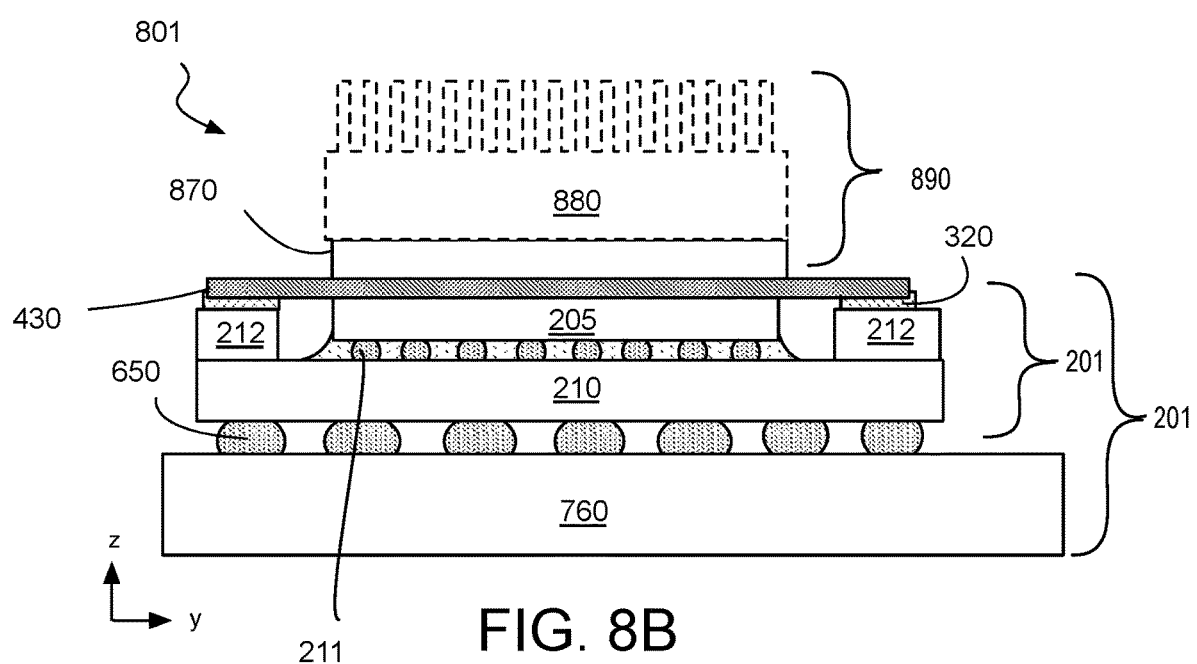

FIG. 8B further illustrates a cross-sectional view of a component assembly 801 that includes IC assembly 201 (e.g., substantially as described above and further includes an IC die thermal solution 890. Component assembly 801 may be part of any type of electronic device or system, such as, but not limited to, a mobile handset, a desktop computer, laptop, or server system. Thermal solution 890 includes a heat exchanger base plate 870 that may be any suitable material, such as a metal (e.g., Cu, Al, Ni, Au). Base plate 870 makes direct contact with the exposed surface of TIM 430. In the illustrated examples, thermal solution 890 further includes a heat sink 880, which is drawn in dashed line to emphasize thermal solution 890 may instead have alternative architectures, such as, but not limited to, a cold plate or a heat pipe. Thermal solution 890 may exert an externally applied pressure of a few PSI to maintain contact between base plate 870 and TIM 430, for example. TIM 430 may also be sintered or otherwise fused to base plate 870 through the application of heat and/or pressure during attachment of thermal solution 890.

Figure 9A:
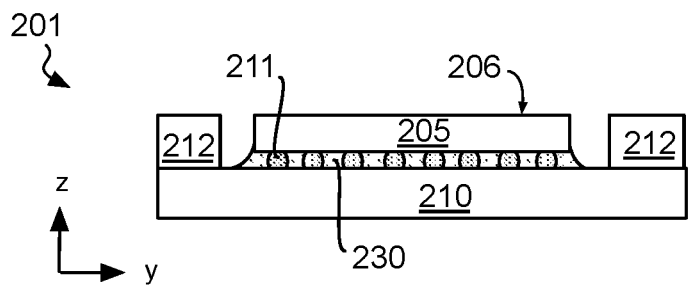
FIGS. 9A, 9B, 9C and 9D illustrate cross-sectional views of an IC assembly evolving as the methods of FIG. 1 are practiced, in accordance with some alternative embodiments.
Figure 9B:
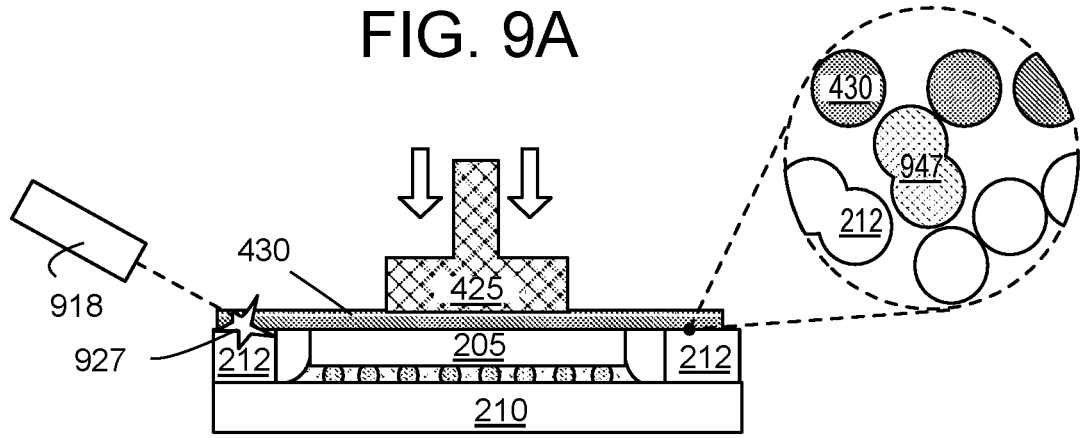

FIGS. 9A, 9B, 9C and 9D illustrate cross-sectional views of another IC assembly evolving as methods 100 are practiced to integrate a metallic second-level TIM during first-level assembly. Beginning again with the IC die assembly 201 shown in FIG. 9A, the TIM is to be attached to at a periphery of IC die 206. In FIG. 9B, for example, TIM 430 is positioned over IC die 205 with pick-and-place machine 425 substantially as described above. While such a metallic TIM may be affixed through an adhesive technique as described above, the metallic TIM composition permits alternative means of attachment. In the absence of any adhesive material, an oversized TIM that extends beyond an edge of an underlying IC die may be soldered or directly fused to an adjacent contact point. For example, in FIG. 9B, a laser 918 is employed to form a weld 927 between stiffener 212 and a region of TIM 430. In place of laser 918, a contact welding technique may be employed.

Weld 927 generally comprises a heat affected zone (HAZ) having at least one of a larger grain size or different phase than is outside of the HAZ. The HAZ surrounds a fusion zone, which begins and ends at the portions of the material that have been coalesced in the liquid state. The fusion zone has a chemical composition that is a mixture of that of stiffener 212 and TIM 430. The fusion zone may be characterized as having one or more fused particles that include both constituents of stiffener 212 and TIM 430. In the expanded view of FIG. 9B, a fused particle 947 that comprise both atoms of stiffener 212 (either a finish material and/or bulk material) and metal atoms of TIM 430. Absent fusing, all particles of TIM 430 would instead remain separate from all particles of stiffener 212. Fused particle 947 may be visible through cross-sectional transmission electron microscopy (TEM), and is indicative of a fusion bond between TIM 430 and stiffener 212 interface in accordance with some embodiments.

Figure 9C:
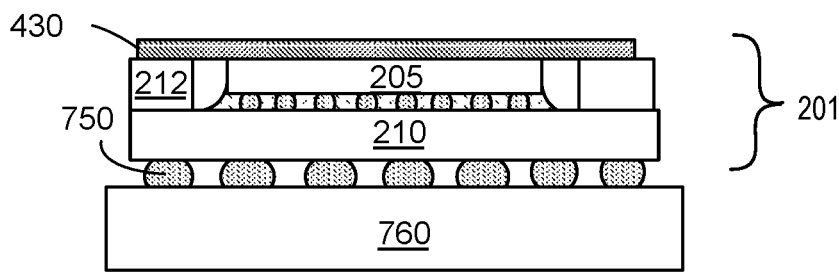
Figure 9D:
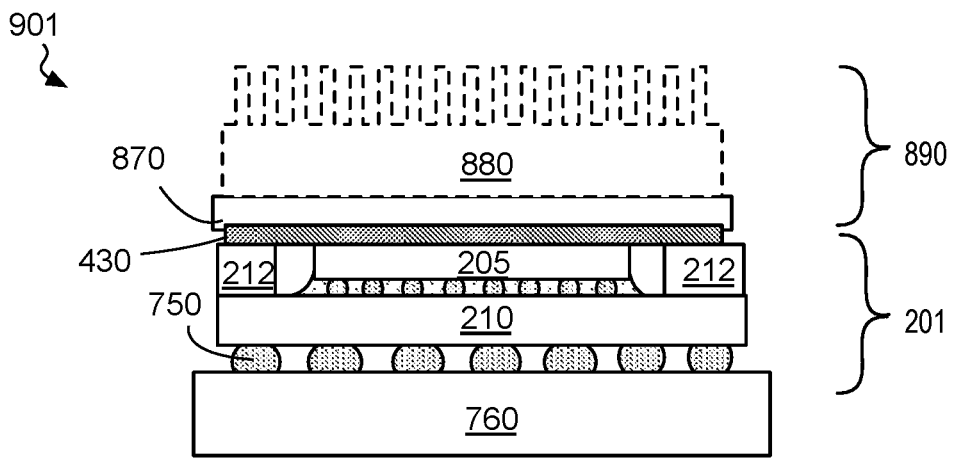

FIG. 9C illustrates second level assembly, where host component 760 is attached to IC assembly 201, for example with solder 2LI 750, substantially as described above. FIG. 9I) illustrates a component assembly 901 following attachment of thermal solution 890 to the free surface of TIM 430. Notably, there is no material between TIM 430 and base plate 870 with the metallic composition of TIM 430 relied upon to develop a low thermal contact resistance with base plate 870. Depending on the thermal treatments associated with the reflow of 2LI 750 and/or the application of thermal solution 890 a fusion bond may also form between metallic particles of TIM 430 and metal particles on a backside of IC die 250 and/or metal particles of base plate 870.

FIGS. 10A, 10B, 10C, 10D, 10E and 10F illustrate cross-sectional views of another IC assembly evolving as methods 100 are practiced to integrate a solder second-level TIM during first level assembly. For solder TIM (STIM) embodiments, the TIM may be any metal with a low melting temperature and since it will reach a liquid state, an intermetallic compound typical of good thermal joints can be expected to form between the TIM and an IC die surface material (e.g., another metal). Application of solder TIM can be challenging due to tight controls needed to form good thermal joints. STIM may therefore may be well-suited to first-level assembly.

Figure 10A:
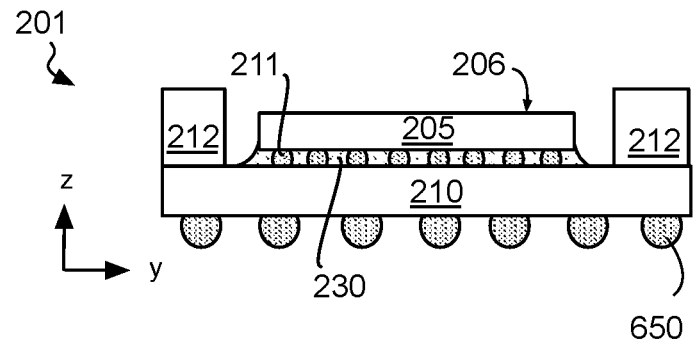

FIG. 10A illustrates IC die assembly 201, which has the features substantially as described above with the exception that the z-height of stiffener 212 may be selected to differ from the height of IC die surface 206 by a controlled amount that facilitates a solder TIM. Solder balls 650 are also attached to a backside of assembly substrate 210 as part of first-level assembly. IC die surface 206 is advantageously a metal capable of forming a good thermal joint, such as, but not limited to, Cu, Ti, Au, or Ni.

Figure 10B:
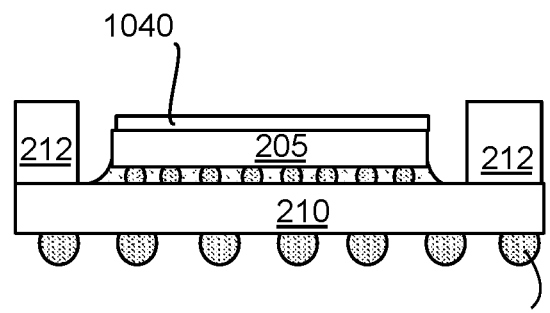
Figure 10C:
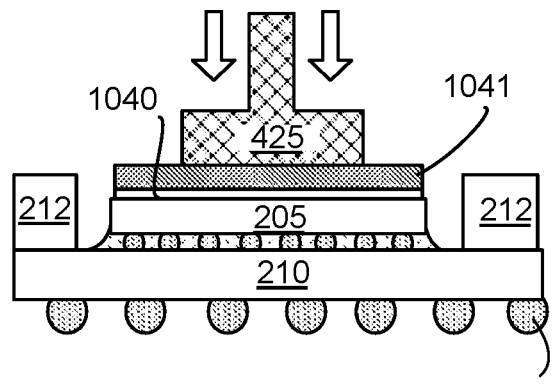

FIG. 10B illustrates application of flux 1040 to IC die surface 206. No flux is applied to stiffener 212 (if present). As shown in FIG. 10C, a solder preform (foil) 1041 is handled and aligned over IC die 205, for example with pick-and-place machine 425. Solder preform 1041 may be held in place by flux 1040 while first-level assembly is completed by reflowing solder preform 1041 into a solder TIM 1050, as further illustrated in FIG. 10C. In this example, solder TIM 1050 is shown to have a meniscus profile to emphasize a liquid state change. In advantageous embodiments, the solder TIM is reflowed at a temperature significantly below a reflow melt temperature of solder balls 650.

During the first solder TIM reflow, an intermetallic compound may form. For example, in the expanded view further shown in FIG. 10D, an intermetallic compound layer 1051 forms between solder TIM 1050 and IC die 205 (e.g., backside metal). Intermetallic compound layer 1051 includes at least one constituent of solder TIM 1050 and one constituent of a backside metal of IC die 205. In some embodiments where solder TIM 1050 comprises at least one of In, Sn, or Ga, intermetallic compound layer 1051 includes at least Ga. In some further embodiments where IC die backside metal comprises at least one of Cu, Ti, Au, or Ni, intermetallic compound layer 1051 includes Ga and at least one of Cu, Ti, Au, or Ni (e.g., $Ga_xCu_y$, $Ga_xNi_y$). Intermetallic compound layer 1051 has some first thickness $H_1$, which increases with higher reflow temperatures and longer reflow durations.

FIG. 10E illustrates second level assembly, where host component 760 is attached to IC assembly 201, for example with solder 2LI 750, substantially as described above. Reflow of 2LI 750 may transition both solder balls and solder TIM 1050 into molten/liquid, states. Hence, during 2LI reflow solder TIM 1050 may experience addition reflow time, increasing the thickness of intermetallic compound layer 1051.

FIG. 10F illustrates a component assembly 1001 following attachment of thermal solution 890 to the free surface of solder TIM 1050. Attachment of thermal solution 890 may, for example, entail first an application of solder flux on the exposed surface of solder TIM 1050 (opposite IC die 205). Base plate 870 may then be placed into the solder flux. With some pressure to hold thermal solution 890 in place, another reflow may be performed (e.g., at a temperature below the reflow temperature of 2LI 750 but sufficient to render solder TIM 1050 molten).

The expanded view of FIG. 10F further illustrates formation of a second intermetallic compound layer 1052 at the interface between base plate 870 and solder TIM 1050. Intermetallic compound layer 1052 includes at least one constituent of solder TIM 1050 and one constituent of a base plate 870 (e.g., a bulk or surface finish element). In some embodiments where solder TIM 1050 comprises at least one of In, Sn, or Ga, intermetallic compound layer 1052 also includes at least Ga. In some further embodiments where base plate 870 comprises at least one of Cu, Au, or Ni, intermetallic compound layer 1052 includes Ga and at least one of Cu, Au, or Ni (e.g., $Ga_xCu_y$, $Ga_xNi_y$). Intermetallic compound layer 1052 forms to some first thickness $H_1$, which increases with reflow temperature and/or reflow duration. Because solder TIM 1050 has reflowed more times in the presence of IC die 205 than in the presence of base plate 870, intermetallic compound layer 1051 can be expected to reach a second thickness $H_2$ that is significantly greater than thickness $H_1$ of intermetallic compound layer 1052. Such a difference in intermetallic compound layer thickness between two sides of a second-level solder TIM is indicative of integrating the solder TIM at first-level assembly.

Figure 11:
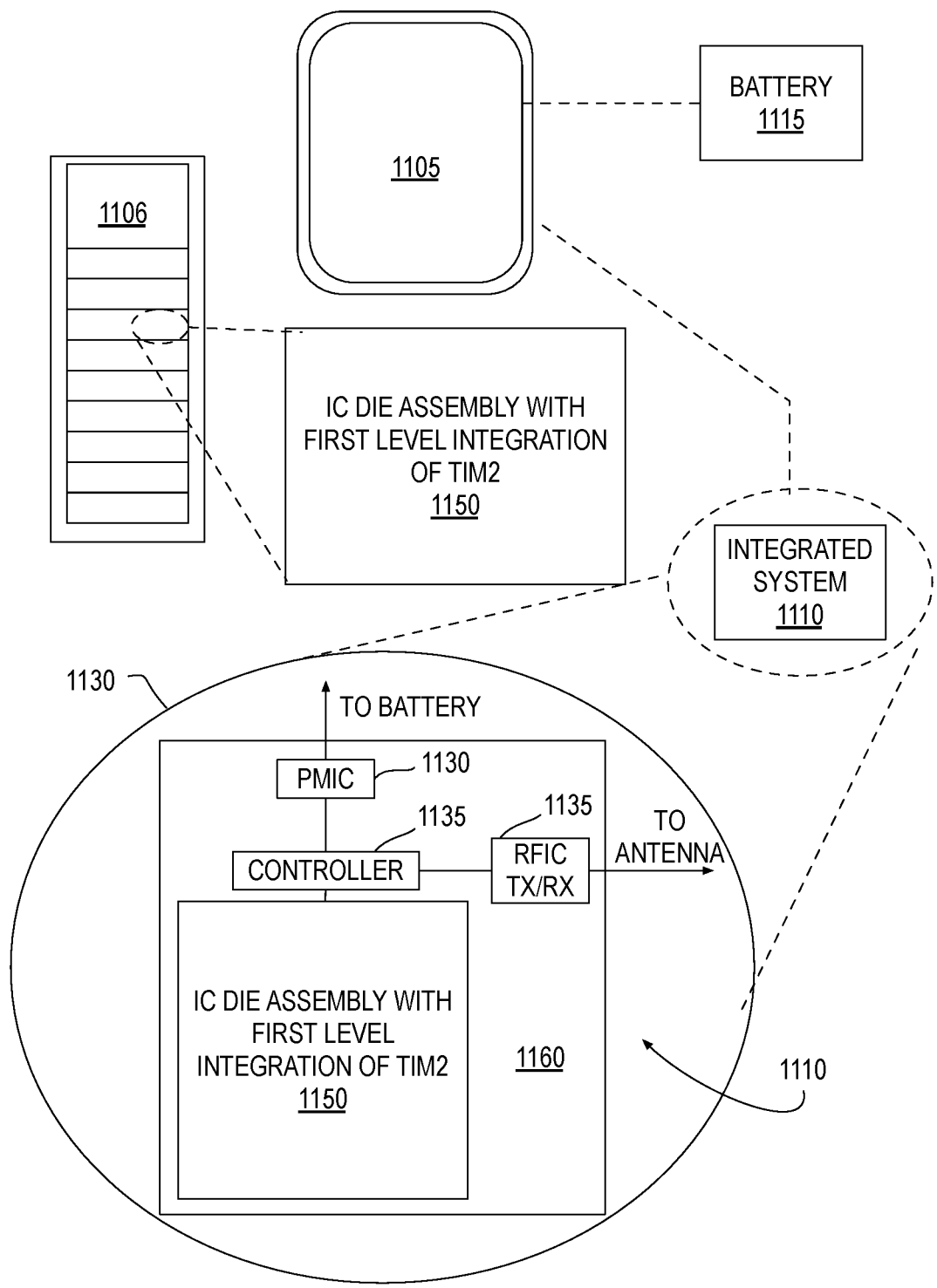
FIG. 11 illustrates a system employing an IC assembly including first-level integration of a second-level thermal interface material, in accordance with some embodiments.

FIG. 11 illustrates some exemplary systems employing an IC assembly with first level integration of a second-level TIM, in accordance with some embodiments. The system may be a mobile computing platform 1105 and/or a data server machine 1106, for example. Either may employ an component assembly further including at least one IC die assembly with first level integration of a second-level TIM IC assembly, for example as described elsewhere herein. The server machine 1106 may be any commercial server, for example including any number of high-performance computing platforms disposed within a rack and networked together for electronic data processing, which in the exemplary embodiment includes an IC assembly with first level integration of a second-level TIM, for example as described elsewhere herein. The mobile computing platform 1105 may be any portable device configured for each of electronic data display, electronic data processing, wireless electronic data transmission, or the like. For example, the mobile computing platform 1105 may be any of a tablet, a smart phone, laptop computer, etc., and may include a display screen (e.g., a capacitive, inductive, resistive, or optical touchscreen), a chip-level integrated system 1110, and a battery 1115.

Whether disposed within the integrated system 1110 illustrated in the expanded view 1120, or as a stand-alone IC assembly within the server machine 1106, the IC die may be a memory chip (e.g., RAM), or a processor chip (e.g., a microprocessor, a multi-core microprocessor, graphics processor, or the like), for example. The IC die may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 12:
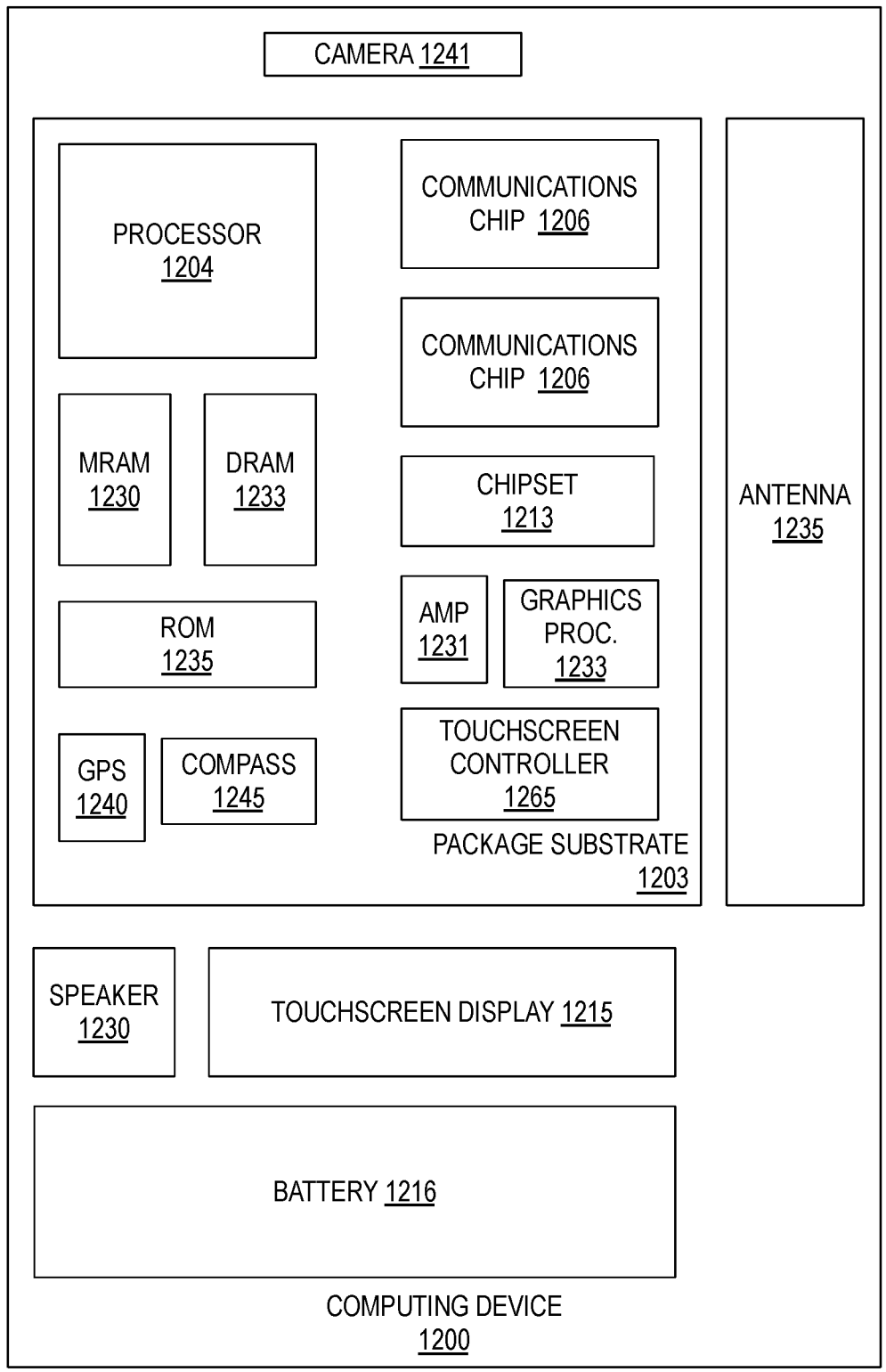
FIG. 12 is a functional block diagram illustrating an electronic computing device, in accordance with an embodiment of the present invention.

FIG. 12 is a functional block diagram of an electronic computing device 1200, in accordance with some embodiments. Device 1200 further includes a motherboard 1202 hosting a number of components, such as, but not limited to, a processor 1204 (e.g., an applications processor). Processor 1204 may be physically and/or electrically coupled to motherboard 1202. In some examples, processor 1204 is within an IC assembly with first level integration of a second-level TIM, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1206 may also be physically and/or electrically coupled to the motherboard 1202. In further implementations, communication chips 1206 may be part of processor 1204. Depending on its applications, computing device 1200 may include other components that may or may not be physically and electrically coupled to motherboard 1202. These other components include, but are not limited to, volatile memory (e.g., DRAM 1232), non-volatile memory (e.g., ROM 1235), flash memory (e.g., NAND or NOR), magnetic memory (MRAM 1230), a graphics processor 1222, a digital signal processor, a crypto processor, a chipset 1212, an antenna 1225, touchscreen display 1215, touchscreen controller 1265, battery 1216, audio codec, video codec, power amplifier 1221, global positioning system (GPS) device 1240, compass 1245, accelerometer, gyroscope, speaker 1220, camera 1241, and mass storage device (such as hard disk drive, solid-state drive (SSD), compact disk (CD), digital versatile disk (DVD), and so forth, or the like.

Communication chips 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1206 may implement any of a number of wireless standards or protocols, including, but not limited to, those described elsewhere herein. As discussed, computing device 1200 may include a plurality of communication chips 1206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) assembly comprises an IC die over, and electrically coupled to, a center region of an assembly substrate. The assembly comprises a stiffener over, and physically coupled to, a peripheral region of the assembly substrate, and a thermal interface material (TIM) over both the center and peripheral regions. The TIM is in direct physical contact with a surface the IC die opposite the assembly substrate, and an adhesive bond or a fusion bond physically couples the TIM to a surface of the stiffener opposite the assembly substrate.

In second examples, for any of the first examples the TIM comprises a polymer, or a metal, or a phase change material (PCM), or graphite, or carbon nanotubes.

In third examples, for any of the first or second examples the TIM is physically coupled to the stiffener through an adhesive material that is between the TIM and the stiffener.

In fourth examples, for any of the third examples the stiffener comprises a contiguous frame that completely surrounds a perimeter the IC die. The TIM covers a majority of the surface of the stiffener opposite the assembly substrate.

In fifth examples, for any of the first through fourth examples the TIM is a contiguous metallic sheet comprising first metal particles, and the stiffener comprises second metal particles.

In sixth examples, for any of the first through fifth examples the TIM is physically coupled to the stiffener through a fusion bond of one or more of the first metal particles with one or more of the second metal particles.

In seventh examples, for any of the sixth examples the IC die surface comprises third metal particles, and there is a fusion bond of one or more of the first metal particles to one or more of the third metal particles.

In eighth examples, an integrated circuit (IC) assembly comprises an IC die over, and electrically coupled to, a region of an assembly substrate, wherein a surface of the IC die, opposite the substrate, comprises a first metal. The assembly comprises a thermal interface material (TIM) over a surface the IC die opposite the assembly substrate. A first intermetallic compound physically couples the TIM to the surface of the IC die. The assembly comprises a heat exchanger base plate over a surface of the TIM opposite the IC die. A second intermetallic compound physically couples the TIM to a surface of the base plate. The first intermetallic compound has a greater thickness than the second intermetallic compound.

In ninth examples, for any of the eighth examples, the IC die is electrically coupled to the assembly substrate through one or more first solder interconnects. The TIM comprises a second metal, and has a lower melting temperature than the first solder interconnects. The first intermetallic compound comprises the first and second metals.

In tenth examples, for any of the eighth through ninth examples, the assembly further comprises a host component, wherein the assembly substrate is electrically coupled to the host component through one or more second solder interconnects, and wherein the TIM has a lower melting temperature than the second solder interconnects.

In eleventh examples, for any of the ninth through tenth examples the first metal is nickel (Ni), or titanium (Ti), or copper (Cu), or gold (Au), and the second metal is indium (In), or gallium (Ga), or tin (Sn).

In twelfth examples, for any of the eleventh examples the first and second intermetallic compounds comprise Ga.

In thirteenth examples, for any of the ninth examples the base plate and the second intermetallic compound comprise the first metal.

In fourteenth examples, for any of the eighth examples the first region of the assembly substrate is a center region, the assembly further comprises a stiffener over, and physically coupled to, a peripheral region of the assembly substrate, and the TIM is absent from a surface of the stiffener opposite the assembly substrate.

In fifteenth examples, a method of manufacturing an integrated circuit (IC) assembly comprises attaching an IC die to a first region of an assembly substrate, attaching a stiffener to a second region of the assembly substrate, adjacent to the IC die, applying a thermal interface material (TIM) to a surface of the IC die opposite the assembly substrate, and to a surface of the stiffener opposite the assembly substrate. The method further comprises affixing the TIM to maintain direct contact with the surface of the IC die by curing an adhesive between the TIM and the stiffener, or by fusing the TIM directly to the stiffener.

In sixteenth examples, for any of the fifteenth examples the method comprises dispensing the adhesive over the surface of the stiffener without dispensing any of the adhesive onto the surface of the IC die.

In seventeenth examples, for any of the fifteenth examples applying the TIM further comprises aligning a preform over the IC die and the stiffener, and physically affixing the TIM comprises curing the adhesive.

In eighteenth examples, for any of the fifteenth examples applying the TIM further comprises aligning a preform over the IC die and the stiffener, and physically affixing the TIM comprises pressing the TIM against the surface of the stiffener while welding a region of the TIM to a region of the surface of the stiffener.

In nineteenth examples, for any of the eighteenth examples the method comprises soldering the assembly substrate to a host substrate, and fusing a base plate of a heat exchanger on a surface of the TIM, opposite the IC die.

In twentieth examples, a method of manufacturing an integrated circuit (IC) assembly comprises receiving an IC die electrically coupled to an assembly substrate with a metal thermal interface material (TIM) that has been reflowed upon a surface of the IC die opposite the assembly substrate. The method comprises joining the assembly substrate and a host component with solder interconnects. The method comprises placing a base plate of a heat exchanger in contact with the metal TIM. The method comprises joining the base plate to the IC die by reflowing the metal TIM.

In twenty-first examples for any of the twentieth examples reflowing the metal TIM comprises melting the metal TIM at a temperature below a reflow temperature of solder interconnects.

In twenty-second examples, for any of the twentieth examples reflowing the metal TIM forms a first intermetallic compound at an interface with the base plate, the first intermetallic compound formed to a thickness less than a second intermetallic compound formed at an interface of the IC die and the metal TIM.

In twenty-third examples, for any of the twentieth through twenty-second examples metal TIM comprises at least one of indium (In), gallium (Ga) or tin (Sn).

In twenty-fourth examples, for any of the twenty-second examples the first and second intermetallic compounds comprise Ga.

In twenty-fifth examples, for any of the twenty-second examples the base plate and the second intermetallic compound comprise one or more of nickel (Ni), or titanium (Ti), or copper (Cu), or gold (Au).

In twenty-sixth examples, for any of the twentieth examples, the method further comprises applying a flux to the surface of the IC die, positioning the metal TIM in contact with the flux, attaching the solder interconnects to a side of the assembly substrate opposite the IC die, and reflowing the metal TIM without reflowing the solder interconnects.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) assembly, comprising:
an IC die over, and electrically coupled to, a center region of an assembly substrate;
a stiffener over, and physically coupled to, a peripheral region of the assembly substrate; and
a continuous layer of thermal interface material (TIM) over both the center and peripheral regions, wherein the TIM is in direct physical contact with a surface of the IC die opposite the assembly substrate, and wherein an adhesive bond or a fusion bond physically couples the TIM to a surface of the stiffener opposite the assembly substrate, and wherein the TIM comprises a polymer, or a metal including one or more of Au, Ag, In, Bi, Ga, or Sn, or a phase change material (PCM), or graphite, or carbon nanotubes.

2. The IC assembly of claim 1, wherein the TIM is physically coupled to the stiffener through an adhesive material that is between the TIM and the stiffener.

3. The IC assembly of claim 1, wherein:
the stiffener comprises a contiguous frame that completely surrounds a perimeter of the IC die; and
the TIM covers a majority of the surface of the stiffener opposite the assembly substrate.

4. The IC assembly of claim 3, wherein:
the TIM is a contiguous metallic sheet comprising first metal particles; and
the stiffener comprises second metal particles.

5. The IC assembly of claim 4, wherein the TIM is physically coupled to the stiffener through a fusion bond of one or more of the first metal particles with one or more of the second metal particles.

6. The IC assembly of claim 5, wherein:
the IC die surface comprises third metal particles; and
there is a fusion bond of one or more of the first metal particles to one or more of the third metal particles.

7. An integrated circuit (IC) assembly, comprising:
an IC die over, and electrically coupled to, a region of an assembly substrate, wherein a surface of the IC die, opposite the substrate, comprises a first metal;
a thermal interface material (TIM) over a surface of the IC die opposite the assembly substrate, wherein a first intermetallic compound physically couples the TIM to the surface of the IC die; and
a heat exchanger base plate over a surface of the TIM opposite the IC die, wherein a second intermetallic compound physically couples the TIM to a surface of the base plate, and wherein the first intermetallic compound has a greater thickness than the second intermetallic compound.

8. The IC assembly of claim 7, wherein:
the IC die is electrically coupled to the assembly substrate through one or more first solder interconnects;
the TIM comprises a second metal, and has a lower melting temperature than the first solder interconnects; and
the first intermetallic compound comprises the first and second metals.

9. The IC assembly of claim 8, further comprising a host component, wherein the assembly substrate is electrically coupled to the host component through one or more second solder interconnects, and wherein the TIM has a lower melting temperature than the second solder interconnects.

10. The IC assembly of claim 8, wherein:
the first metal is nickel (Ni), or titanium (Ti), or copper (Cu), or gold (Au); and
the second metal is indium (In), or gallium (Ga), or tin (Sn).

11. The IC assembly of claim 10, wherein the first and second intermetallic compounds comprise Ga.

12. The IC assembly of claim 11, wherein the base plate and the second intermetallic compound comprise the first metal.

13. The IC assembly of claim 7, wherein the region of the assembly substrate is a center region, the assembly further comprises a stiffener over, and physically coupled to, a peripheral region of the assembly substrate, and the TIM is absent from a surface of the stiffener opposite the assembly substrate.

14. A method of manufacturing an integrated circuit (IC) assembly, the method comprising:
attaching an IC die to a first region of an assembly substrate;
attaching a stiffener to a second region of the assembly substrate, adjacent to the IC die;
applying a continuous layer of thermal interface material (TIM) to a surface of the IC die opposite the assembly substrate, and to a surface of the stiffener opposite the assembly substrate, wherein the TIM comprises a polymer, or a metal including one or more of Au, Ag, In, Bi, Ga, or Sn, or a phase change material (PCM), or graphite, or carbon nanotubes; and
affixing the TIM to maintain direct contact with the surface of the IC die by curing an adhesive between the TIM and the stiffener, or by fusing the TIM directly to the stiffener.

15. The method of claim 14, further comprising dispensing the adhesive over the surface of the stiffener without dispensing any of the adhesive onto the surface of the IC die.

16. The method of claim 14, wherein:
applying the TIM further comprises aligning a preform over the IC die and the stiffener; and
physically affixing the TIM comprises curing the adhesive.

17. The method of claim 14, wherein:
applying the TIM further comprises aligning a preform over the IC die and the stiffener; and
physically affixing the TIM comprises pressing the TIM against the surface of the stiffener while welding a region of the TIM to a region of the surface of the stiffener.

18. The method of claim 17, further comprising:
soldering the assembly substrate to a host substrate; and fusing a base plate of a heat exchanger on a surface of the TIM, opposite the IC die.

* * * * *